United States Patent [19]
Rogers et al.

[11] Patent Number: 6,144,157
[45] Date of Patent: Nov. 7, 2000

[54] ORGANIC EL DEVICE WITH FLUOROCARBON LIQUID AND UV EPOXY LAYERS AND METHOD

[75] Inventors: Stephen P. Rogers, Phoenix; Matthew Kim, Scottsdale, both of Ariz.

[73] Assignee: Motorola, Inc., Schaumburg, Ill.

[21] Appl. No.: 09/080,371

[22] Filed: May 18, 1998

[51] Int. Cl.⁷ ....................................... H01J 1/62
[52] U.S. Cl. ................................ 313/512; 445/24
[58] Field of Search ................. 445/24; 313/498, 313/502, 503, 504, 506, 507, 509, 511, 512, 412

[56] References Cited

U.S. PATENT DOCUMENTS

| | | | |
|---|---|---|---|
| 4,104,555 | 8/1978 | Fleming | 313/512 |
| 4,767,679 | 8/1988 | Kawachi | 428/690 |
| 5,413,965 | 5/1995 | Webb et al. | |
| 5,427,858 | 6/1995 | Nakamura et al. | |
| 5,469,019 | 11/1995 | Mori | 313/509 |
| 5,632,663 | 5/1997 | Ishihara et al. | 445/25 |
| 5,821,692 | 10/1998 | Rogers et al. | 313/512 |
| 5,962,962 | 10/1999 | Fujita et al. | 313/412 |

FOREIGN PATENT DOCUMENTS 9035868   2/1997   Japan.

*Primary Examiner*—Vip Patel
*Assistant Examiner*—Matthew J. Gerike
*Attorney, Agent, or Firm*—Eugene A. Parsons; Lanny L. Parker

[57] ABSTRACT

Electroluminescent apparatus comprising an organic electroluminescent device having an active organic region, an inert fluorocarbon liquid layer covering substantially the active organic region, and an epoxy layer encapsulating substantially the inert fluorocarbon liquid layer and the active organic region.

6 Claims, 1 Drawing Sheet

ORGANIC EL DEVICE WITH FLUOROCARBON LIQUID AND UV EPOXY LAYERS AND METHOD

FIELD OF THE INVENTION

This invention relates generally to the field of electroluminescent apparatus and, more particularly, to organic electroluminescent displays and improved methods of manufacturing and encapsulating organic electroluminescent displays.

BACKGROUND OF THE INVENTION

Electroluminescent (EL) apparatus may be classified as organic or inorganic. Electroluminescent apparatus exhibit high visibility due to inherent self-emission characteristics and provide excellent impact resistance and handling ability. As a result, research, development and practical utilization of EL apparatus as a pixel for graphic display, a pixel for a television image display and as a light source are currently underway.

Organic EL apparatus normally include a laminate structure having, among other things, a light-emitting layer formed of a fluorescent organic solid and electrode apparatus. This laminate structure is normally formed on a substrate such as glass. This type of organic EL apparatus exhibits light emission characteristics provided when electrons injected into the light-emitting layer are recombined. As a result, organic EL apparatus actuate at a low voltage and exhibit a level of brightness proportional to the injected electric current. By changing the type of fluorescent organic solids comprising the light-emitting layer, light emission may be obtained through substantially the entire visible light region.

The fluorescent organic solids commonly used to form the light-emitting layer of organic EL apparatus are susceptible to water, oxygen and other environmental elements present in ambient conditions. Furthermore, electrode apparatus formed on the light-emitting layer is also prone to oxidation from exposure to water, oxygen, etc. As a result, conventional organic EL apparatus exhibit a short life as a usable device in atmospheric conditions. To increase the life of organic EL apparatus, electrode apparatus and the light emitting layer must be protected from water, oxygen and other environmental elements.

To increase the life of organic EL apparatus in this regard, various methods and techniques have been devised for encapsulating organic EL apparatus with protective layers of varying compositions. Although exemplary, such methods and techniques are difficult and expensive to implement and/or yield largely nominal results.

Accordingly, it would be highly desirable to provide improved organic EL apparatus and improved methods of encapsulating organic EL displays.

It is a purpose of the present invention to provide a new and improved method of encapsulating organic EL apparatus that is highly effective for extending operating life.

It is another purpose of the present invention to provide a new and improved method of encapsulating organic EL apparatus that is easy to implement.

It is still another purpose of the present invention to provide a new and improved method of encapsulating organic EL apparatus that is inexpensive.

It is a further purpose of the present invention to provide new and improved organic EL apparatus highly resistant to degradation from exposure to ambient environmental conditions.

SUMMARY OF THE INVENTION

The above problems and others are at least partially solved and the above purposes and others are realized in new and improved organic EL apparatus (herein including one or more pixels on one or more substrates) and improved methods of manufacturing and encapsulating organic EL apparatus. In a specific embodiment of the present invention, organic EL apparatus is generally comprised of an organic EL device having an active organic region, an inert fluorocarbon liquid layer covering substantially the active organic region, and an ultraviolet (UV) light-curable epoxy layer encapsulating substantially the inert fluorocarbon liquid layer and the active organic region. The inert fluorocarbon liquid layer and the UV light-curable epoxy layer cooperate to bound the active organic region in an environmentally controlled environment to protect the active organic region from exposure to water, oxygen and other elements present in ambient environmental conditions.

Consistent with the foregoing, associated methods of manufacturing and encapsulating organic EL apparatus may also be provided.

BRIEF DESCRIPTION OF THE DRAWINGS

The foregoing and further and more specific objects and advantages of the instant invention will become readily apparent to those skilled in the art from the following detailed description thereof taken in conjunction with the drawings in which.

DETAILED DESCRIPTION OF A PREFERRED EMBODIMENT

The present invention provides, among other things, improved organic EL apparatus and improved methods of manufacturing and encapsulating organic EL displays. The present invention utilizes inert fluorocarbon liquids and ultraviolet (UV) light-curable epoxy to encapsulate active organic regions of organic EL displays for protecting one or more fluorescent organic solids and/or electrode apparatus from exposure to water, oxygen and other elements present in normal ambient conditions that may otherwise degrade one or more of the fluorescent organic solids and/or electrode apparatus.

Figure 1:
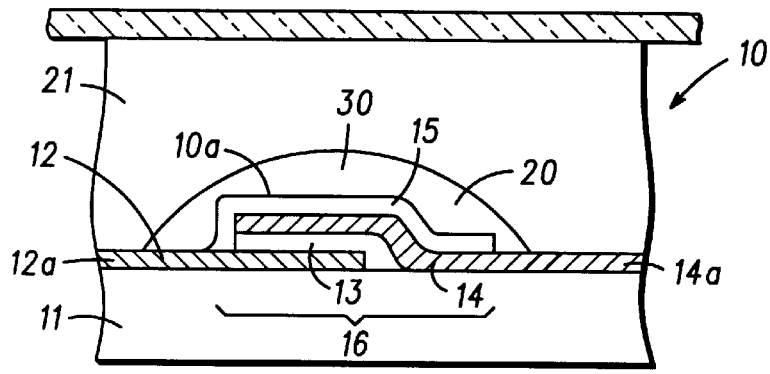
FIG. 1 illustrates a sectional view of organic EL apparatus, in accordance with the present invention.

Turning to FIG. 1, illustrated is a sectional view of organic EL apparatus 10, in accordance with the present invention. Like conventional organic EL apparatus, apparatus 10 is generally comprised of an El device or display 10*a* carried by or otherwise mounted with a glass, plastic or other transparent supporting structure, hereinafter referred to as substrate 11. Device 10*a* is generally comprised of laminate structure having sequentially layered elements including positive electrode apparatus 12 provided in the form of indium tin oxide (ITO) or other electrically conducting transparent film or layer, a light emitting layer 13 provided in the form of one or more organic electroluminescent material films or layers, opposing negative electrode apparatus 14 provided in the form of a cathode metal layer, and an integrated encapsulation layer 15. Integrated encapsulation layer 15 is an optional feature and need not be present and, thus, is set forth merely for the purposes of illustration and example.

In accordance with conventional practice, positive and negative electrode apparatus 12 and 14 each include an extension 12a and 14a, respectively, that serve as lead wires. Furthermore, a region of device 10a generally denoted at 16 and defined substantially by light emitting layer 13 defines an active organic area or region of apparatus 10.

With continuing reference to FIG. 1, and unlike conventional organic EL apparatus, apparatus 10 further includes sequentially layered protective features or layers including an inert fluorocarbon liquid layer 20 deposited to cover or otherwise encapsulate substantially active region 16, and a sealing layer 21 deposited to localize, cover, surround and otherwise encapsulate substantially layer 20 and active region 16. The deposition of sealing layer 21 may be carried out via conventional encapsulation schemes such as, for instance, a glob-top encapsulation scheme.

Layer 20 functions as a hydrophobic liquid layer. Furthermore, because layer 20 is inert, it is thus chemically un-reactive and physically stable. In accordance with the present invention, layer 20 is preferably comprised of inert fluorocarbon liquids such as FC40, FG43, or FC70, and the like, found in commerce under the exemplary trademark FLUORINERT®. Inert fluorocarbon liquids are fully fluorinated structures such as perfluoroalkanes and the like having average molecular weights in the range of 340–910, typical boiling points ranging from 50° C.–260° C., vapor pressures between 0.005 Torr–250 Torr, and viscosities ranging from 0.1 to 50 centistokes. Furthermore, sealing layer 21 is preferably comprised of an epoxy layer and, more particularly, an ultraviolet (UV) light-cured epoxy layer.

With active region 16 encapsulated substantially with liquid layer 20 and sealing layer 21, layers 20 and 21 cooperate to protect active region 16, and hence electrode apparatus 12 and 14 and light emitting layer 13, from exposure to water, oxygen and other environmental elements present in normal ambient conditions that may otherwise cause light emitting layer to degrade and/or electrode apparatus 12 and 14 to oxidize or otherwise degrade from exposure. Extensive experimentation has shown that the liquid and sealing layers 20 and 21 prove exemplary for providing (1) an initial and immediate effective barrier resistant to the diffusion of water and oxygen; (2) an inert, benign environment for active region 16; (3) minimal adhesion of sealing layer 21 with active region 16 thus minimizing delamination of at least negative electrode apparatus 14 from the active region 16 due to shrinkage or thermal stressing of sealing layer 21 upon curing; and (4) the formation of a cavity 30 around the active region 16 comprising liquid layer 20 and defining an environmentally controlled environment or buffer zone between active region 16 and sealing layer 21, all of which contribute to greatly enhancing the operating lifetime of apparatus 10. Furthermore, seepage or spread of liquid layer 20 throughout sealing layer 21 fills naturally occurring voids in sealing layer 21 thus providing exemplary repulsion of water out of the encapsulated area defined generally by cavity 30.

Figure 2:
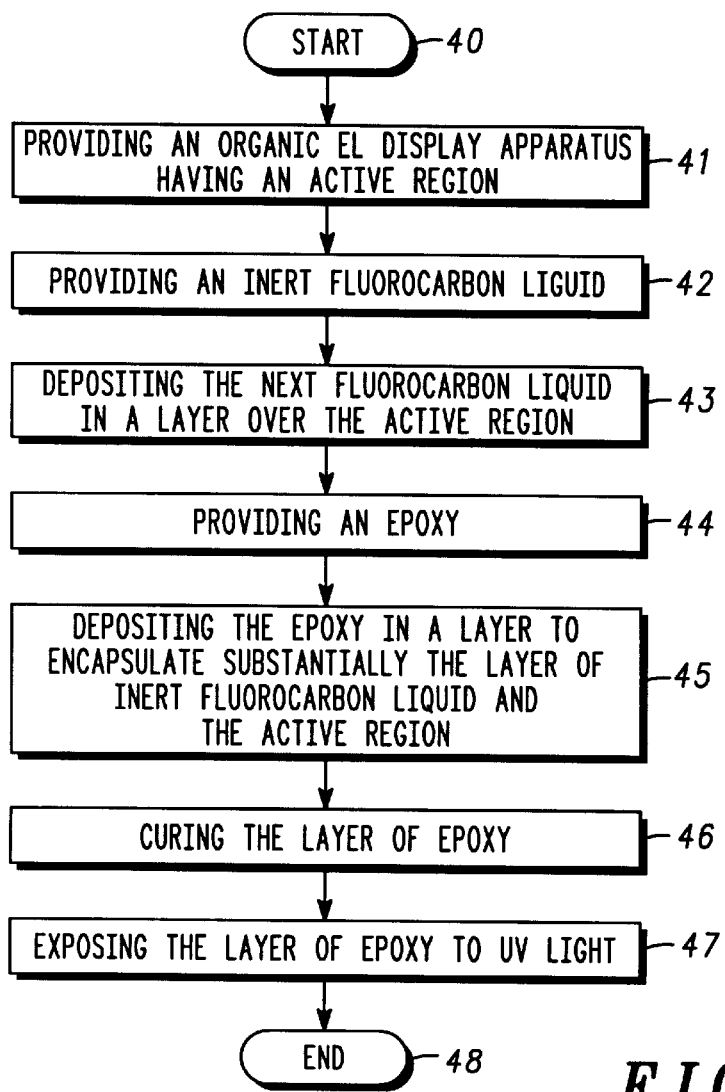
FIG. 2 illustrates a block diagram of a method of encapsulating organic EL apparatus, in accordance with the present invention.

Turning to FIG. 2, illustrated of a flow chart of a preferred method of encapsulating an organic EL apparatus, in accordance with the present invention. Consistent with the preceding discussion, the present method starts 40 with providing 41 an organic EL apparatus having an active region, providing 42 an inert fluorocarbon liquid and depositing 43, such as with a syringe, the inert fluorocarbon liquid in a layer over the active region. The method further includes the steps of providing 44 an epoxy, such as a conventional Three Bond 30Y-184G UV-curable epoxy or other selected UV light-curable epoxy, and depositing 45 the epoxy in a layer to localize, surround and encapsulate substantially the layer of inert fluorocarbon liquid and the active region. After deposition of the epoxy, the method further includes the steps of curing 46 the layer of epoxy. Preferably provided in the form of a UV light-curable epoxy, the curing of the epoxy layer may be carried out, for instance, by exposing 47 the layer of epoxy to UV light with a flux density of at least, for instance, approximately 80–100 mw/cm2 to end 48 the method. An optional cover structure, including one or more layers, substrates, etc., can be pressed onto the epoxy layer, generally before curing the epoxy layer.

In summary, the present invention proposes exemplary teachings of using inert fluorocarbon liquids in an encapsulation scheme with a UV light-curable epoxy in packaging of moisture and oxygen-sensitive organic EL apparatus. The invention is easy and inexpensive to implement, and proves exemplary for enhancing the operating lifetime of the organic EL displays. In addition to the liquid and sealing layers 20 and 21, covers such as glass, plastic, stamped metal foils, plastic circuit boards (PCB), ceramic cans, machined metal cans, or semiconductor substrates may be employed if desired.

The present invention has been described above with reference to a preferred embodiment. However, those skilled in the art will recognize that changes and modifications may be made in the described embodiments without departing from the nature and scope of the present invention. Furthermore, those have regard toward the relevant art will appreciate that although apparatus 10, with the exception of the liquid and sealing layers 20 and 21, includes specific structural features consistent with conventional organic EL display apparatus, other physical constitutions may be employed consistent with conventional organic EL apparatus generally of the type herein set forth.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. Electroluminescent apparatus, comprising:

an organic electroluminescent device having an active organic region;

an inert fluorocarbon liquid layer covering the active organic region; and an epoxy layer, including an ultraviolet light-cured epoxy layer, encapsulating the inert fluorocarbon liquid layer and the active organic region.

2. The electroluminescent device of claim 1, including in addition a cover structure adhered to the epoxy layer.

3. The electroluminescent device of claim 2, wherein the cover includes one of glass, plastic, stamped metal foils, plastic circuit boards (PCB), ceramic cans, machined metal cans, and semiconductor substrates.

4. A method of encapsulating organic electroluminescent apparatus having an active organic region, comprising the steps of:

covering the active organic region with an inert fluorocarbon liquid layer;

covering the inert fluorocarbon liquid layer and the active organic region with an ultraviolet light-curable epoxy layer; and curing the epoxy layer by exposing the ultraviolet light-curable epoxy layer to ultraviolet light.

5. The method of claim 4, including in addition a step of adhering a cover structure to the epoxy layer so as to cover the epoxy layer.

6. The method of claim 5, wherein the step of adhering a cover includes adhering a cover including one of glass, plastic, stamped metal foils, plastic circuit boards (PCB), ceramic cans, machined metal cans, and semiconductor substrates.

* * * * *